United States Patent [19]

Ferrier et al.

[11] Patent Number: 6,020,029
[45] Date of Patent: Feb. 1, 2000

[54] PROCESS FOR TREATING METAL SURFACES

[75] Inventors: Donald Ferrier, Thomaston; Frank Durso, Cheshire, both of Conn.

[73] Assignee: MacDermid, Incorporated, Waterbury, Conn.

[21] Appl. No.: 09/143,898

[22] Filed: Aug. 31, 1998

Related U.S. Application Data

[63] Continuation-in-part of application No. 08/873,992, Jun. 12, 1997, Pat. No. 5,869,130.

[51] Int. Cl.$^7$ .............................. B05D 3/00; C23C 22/82
[52] U.S. Cl. ......................... 427/333; 427/337; 427/327; 148/272; 148/282
[58] Field of Search .................................. 427/327, 333, 427/337; 148/272, 282, 283, 273

[56] References Cited

U.S. PATENT DOCUMENTS

| | | | |
|---|---|---|---|
| 4,395,301 | 7/1983 | Bauer et al. | 156/307.5 |
| 4,409,037 | 10/1983 | Landau | 148/6.14 R |
| 4,512,818 | 4/1985 | Valayil et al. | 148/6.14 R |
| 4,629,679 | 12/1986 | Uchida et al. | 430/281 |
| 4,642,161 | 2/1987 | Akahoshi et al. | 156/630 |
| 4,775,444 | 10/1988 | Cordani | 156/634 |
| 4,844,981 | 7/1989 | Landau | 428/413 |
| 4,902,551 | 2/1990 | Nakajo et al. | 428/137 |
| 4,981,560 | 1/1991 | Kajihara et al. | 204/27 |
| 4,997,516 | 3/1991 | Adler | 156/630 |
| 4,997,722 | 3/1991 | Adler | 428/596 |
| 5,289,630 | 3/1994 | Ferrier et al. | 29/830 |
| 5,532,094 | 7/1996 | Arimura et al. | 252/79.1 |
| 5,800,859 | 9/1998 | Price et al. | 427/98 |
| 5,840,363 | 11/1998 | Rosch et al. | 427/97 |

FOREIGN PATENT DOCUMENTS 9619097  6/1996  WIPO .............................. H05K 3/38

*Primary Examiner*—Shrive Beck
*Assistant Examiner*—Jennifer Calcagni
*Attorney, Agent, or Firm*—John L. Cordani

[57] ABSTRACT

A process for treating metal surfaces that includes first contacting the metal surface with a particular acidic peroxide adhesion promoting composition, followed by contacting that metal surface with an alkaline solution. This treatment is particularly suitable for treating metal surfaces used in printed circuit multilayer construction.

20 Claims, No Drawings

PROCESS FOR TREATING METAL SURFACES

This application is a continuation-in-part of U.S. patent application Ser. No. 08/873,992, filed on Jun. 12, 1997, now U.S. Pat. No. 5,869,130.

BACKGROUND OF THE INVENTION

1. Field of the Invention

This invention relates to an improvement to the process of providing innerlayer integrity in printed circuit multilayer board construction by the use of an acidic peroxide treatment composition also containing a corrosion inhibitor with the preferable inclusion of a halide ion source and the optional inclusion of water soluble polymers. In particular, the present invention relates to use of an alkaline solution treatment after the acidic peroxide treatment to treat metal surfaces in printed circuit multilayer board construction.

2. Brief Description of Art

Printed circuits containing one or more circuitry innerlayers are in prominent use today as demand increases for further and further weight and space conservation in electronic devices.

In the typical fabrication of a multilayer printed circuit, patterned circuitry innerlayers are first prepared by a process in which a copper foil-clad dielectric substrate material is patterned with resist in the positive image of the desired circuitry pattern, followed by etching away of the exposed copper. Upon removal of the resist, there remains the desired copper circuitry pattern.

One or more circuitry innerlayers of any particular type or types of circuitry pattern, as well as circuitry innerlayers which might constitute ground planes and power planes, are assembled into a multilayer circuitry by interposing one or more partially-cured dielectric substrate material layers (so called "per preg" layers) between the circuitry innerlayers to form a composite of alternating circuitry innerlayers and dielectric substrate material. The composite is then subjected to heat and pressure to cure the partially cured substrate material and achieve bonding of circuitry innerlayers thereto. The so cured composite will then have a number of through holes drilled therethrough, which are then metallized to provide a means for conductively interconnecting all circuitry layers. In the course of the through hole metallizing process, desired circuitry patterns will also typically be formed on the outer facing layers of the multilayer composite.

An alternate approach to the formation of a multilayer printed circuit board is through additive or surface laminer circuitry techniques. These techniques begin with a non-conductive substrate, upon which the circuit elements are additively plated. Further layers are achieved by repeatedly applying an imageable coating upon the circuitry and plating further circuit elements upon the imageable coating.

It has long been known that the strength of the adhesive bond formed between the copper metal of the circuitry innerlayers and the cured pre-preg layers, or other non-conductive coatings, in contact therewith leaves something to be desired, with the result that the cured multilayer composite or the coating is susceptible to delamination in subsequent processing and/or use. In response to this problem, the art developed the technique of forming on the copper surfaces of the circuitry innerlayers (before assembling them with pre-preg layers into a multilayer composite) a layer of copper oxide, such as by chemical oxidation of the copper surfaces. The earliest efforts in this regard (so-called "black oxide" adhesion promoters) produced somewhat minimal improvement in the bonding of the circuitry innerlayers to the dielectric substrate layers in the final multilayer circuit, as compared to that obtained without copper oxide provision. Subsequent variations on the black oxide technique included methods wherein there is first produced a black oxide coating on the copper surface, followed by post-treatment of the black oxide deposit with 15% sulfuric acid to produce a "red oxide" to serve as the adhesion promoter, such as disclosed by A. G. Osborne, "An Alternate Route To Red Oxide For Inner Layers", PC Fab. August, 1984, as well as variations involving direct formation of red oxide adhesion promoter, with varying degrees of success being obtained. The most notable improvement in this art is represented in the U.S. Pat. Nos. 4,409,037 and 4,844,981 to Landau, the teachings both of which are incorporated herein by reference in their entirety, involving oxides formed from relatively high chlorite/relatively low caustic copper oxidizing compositions, and producing substantially improved results in circuitry inner layer adhesion.

As earlier noted, the assembled and cured multilayer circuit composite is provided with through-holes which then require metallization in order to serve as a means for conductive interconnection of the circuitry layers of the circuit. The metallizing of the through-holes involves steps of resin desmearing of the hole surfaces, catalytic activation, electroless copper depositing, electrolytic copper depositing, and the like. Many of these process steps involve the use of media, such as acids, which are capable of dissolving the copper oxide adhesion promoter coating on the circuitry innerlayer portions exposed at or near the through hole. This localized dissolution of the copper oxide, which is evidenced by formation around the through-hole of a pink ring or halo (owing to the pink color of the underlying copper metal thereby exposed), can in turn lead to localized delamination in the multilayer circuit.

The art is well aware of this "pink ring" phenomenon, and has expended extensive effort in seeking to arrive at a multilayer printed circuit fabrication process which is not susceptible to such localized delamination. One suggested approach has been to provide the adhesion promoting copper oxide as a thick coating so as to retard its dissolution in subsequent processing simply by virtue of sheer volume of copper oxide present. This turns out to be essentially counter-productive, however, because the thicker oxide coating is inherently less effective as an adhesion promoter per se. Other suggestions relating to optimization of the pressing/curing conditions for assembling the multilayer composite have met with only limited success.

Other approaches to this problem involve post-treatment of the copper oxide adhesion promoter coating prior to assembly of circuitry innerlayers and pre-preg layers into a multilayer composite. For example, U.S. Pat. No. 4,775,444 to Cordani discloses a process in which the copper surfaces of the circuitry innerlayers are first provided with a copper oxide coating and then contacted with an aqueous chromic acid solution before the circuitry innerlayers are incorporated into the multilayer assembly. The treatment serves to stabilize and/or protect the copper oxide coating from dissolution in the acidic media encountered in subsequent processing steps (e.g., through-hole metallization), thereby minimizing pink ring/delamination possibilities.

U.S. Pat. No. 4,642,161 to Akahoshi et al., U.S. Pat. No. 4,902,551 to Nakaso et al., and U.S Pat. No. 4,981,560 to Kajihara et al., and a number of references cited therein, relate to processes in which the copper surfaces of the circuitry innerlayers, prior to incorporation of the circuitry innerlayers into a multilayer circuit assembly, are first treated to provide a surface coating of adhesion-promoting copper oxide. The copper oxide so formed is then reduced to metallic copper using particular reducing agents and conditions. As a consequence, the multilayer assembly employing such circuitry innerlayers will not evidence pink ring formation since there is no copper oxide present for localized dissolution, and localized exposure of underlying copper, in subsequent through-hole processing. As with other techniques, however, processes of this type are suspect in terms of the adhesion attainable between the dielectric substrate layers and the metallic copper circuitry innerlayers. This is particularly so in these reduction processes since the circuitry bonding surface not only is metallic copper, but also presents the metallic copper in distinct phases (i.e. (1) copper-from-reduction-of-copper oxide over (2) copper of the copper foil) which are prone to separation/delamination along the phase boundary.

U.S. Pat. Nos. 4,997,722 and 4,997,516 to Adler similarly involve formation of a copper oxide coating on the copper surfaces of circuitry innerlayers, followed by treatment with a specialized reducing solution to reduce the copper oxide to metallic copper. Certain portions of the copper oxide apparently may not be reduced all the way to metallic copper (being reduced instead to hydrous cuprous oxide or cuprous hydroxide), and those species are thereafter dissolved away in a non-oxidizing acid which does not attack or dissolve the portions already reduced to metallic copper. As such, the multilayer assembly employing such circuitry innerlayers will not evidence pink ring formation since there is no copper oxide present for localized dissolution, and localized exposure of underlying copper, in subsequent through-hole processing. Here again, however problems can arise in terms of the adhesion between the dielectric layers and metallic copper circuitry innerlayers, firstly because the bonding surface is metallic copper, and secondly because the metallic copper predominately is present in distinct phases (i.e., (1) copper-from-reduction-of-copper oxide over (2) copper of the copper foil), a situation prone to separation/delamination along the phase boundary.

U.S. Pat. No. 5,289,630 to Ferrier et al., the teachings of which are incorporated herein by reference in their entirety, reveals a process whereby an adhesion promotion layer of copper oxide is formed on the circuit elements followed by a controlled dissolution and removal of a substantial amount of the copper oxide in a manner which does not adversely affect the topography.

PCT Application No. WO96/19097 to McGrath, the teachings of which are incorporated by reference herein in their entirety, discusses a process for improving the adhesion of polymeric materials to a metal surface. The process discussed involves contacting the metal surface with an adhesion-promoting composition comprising hydrogen peroxide, an inorganic acid, a corrosion-inhibitor and a quaternary ammonium surfactant.

U.S. Pat. No. 5,869,130, to Ferrier entitled "Process For Improving Adhesion of Polymeric Materials to Metal Surfaces" describes a process for improving the adhesion of polymeric materials to a metal surface, especially copper or copper alloy surfaces in the production of multilayer printed circuits. The process described in this patent application provides for contacting the metal surface with an adhesion-promoting composition comprising (a) an oxidizer; (b) an acid; (c) a corrosion inhibitor; (d) a source of halide ions; and (e) optionally, a water soluble polymer. That process provided excellent adhesion between the metallic and polymeric surfaces (i.e. the circuitry and the intermediate insulating layer), while eliminating or minimizing pink ring and operating economically, as compared to above noted conventional processes.

However, it has been found that the use of acidic peroxide treatment solutions, while giving good peel strength and stability of copper laminated to fiberglass filled resin, allows the occurrence of some flaws on further processing of the laminated board to create a finished printed circuit board. Thus, with some resin systems, particularly lower $T_g$ materials, drilling removes a small quantity of organic material from the surface of the etch treated copper at the point where the drill intersects with the copper layer; this phenomenon is called "wedge". Further processing the drilled board through the chemical steps of preparing and plating the board creates a small area at the treated copper surface around the drilled hole where the coating is attacked and removed, creating a phenomenon called "pink ring". This area of pink ring is much smaller than the pink ring observed in standard oxide processing to prepare copper surfaces for lamination. Nevertheless, in this area of attack small areas of resin contracting from the copper surface can be observed after floating the board in molten solder. Although these areas of resin contraction (called "resin voids") may not be sufficient cause for rejection of the board they are still a concern.

In particular, it has been found that these wedge, pink ring and resin void flaws can be greatly reduced or eliminated by processing the board treated with these acidic peroxide treatment solutions through a strongly alkaline post treatment, followed by rinsing and drying.

BRIEF SUMMARY OF THE INVENTION

One embodiment of the present invention is directed to a process where the adhesion between a metal surface and a polymeric material is enhanced by contacting the metal surface with an adhesion-promoting composition followed by an alkaline treatment prior to bonding the polymeric material to the metal surface. The invention therefore proposes a process for treating a metal surface, said process comprising:

1) contacting the metal surface with an adhesion-promoting composition comprising:
   a) an oxidizer;
   b) an acid;
   c) a corrosion inhibitor;
   d) optionally, but preferably, a source of halide ions; and
   e) optionally, but preferably, a water soluble polymer;
2) then treating the metal surface with an alkaline treatment.

Thereafter, the polymeric material can be bonded to the metal surface.

DETAILED DESCRIPTION OF THE PREFERRED EMBODIMENTS

The present invention is particularly suitable for treating copper surfaces with a combination of an acidic peroxide adhesion-promoting composition followed by an alkaline treatment.

The adhesion-promoting composition produces a micro-roughened conversion-coated surface upon the metal. The surface produced is particularly suited to bonding with polymeric material in that significantly increased adhesion values are achieved as compared to a non-treated metal surface. In addition the conversion coated (treated) metal surface maintains the increased adhesion over time and decreases the likelihood of any unwanted reactions occurring over time between the metal and the polymeric material.

The present process is particularly suited to the manufacture of multilayer printed circuit boards. Thus, in this application, the metal circuitry (usually copper) of the innerlayers is treated with the adhesion-promoting composition proposed herein. After the foregoing treatment followed by, water rinsing, further treatment in the alkaline solution proposed herein, and further water rinsing, the innerlayers are bonded together with polymeric materials such as pre-pregs or imageable dielectrics, resulting in the multilayer printed circuit board.

The metal surface to be treated may comprise a variety of metals such as copper, nickel, iron and alloys of each of the foregoing. However, the process of the invention produces the best results when the metal surfaces comprise copper or copper alloys. The polymeric material may be a variety of polymeric materials including pre-preg materials, imageable dielectrics, photoimageable resins, soldermasks, adhesives or polymeric etch resists.

The oxidizer used in the adhesion-promoting composition may comprise any oxidizer which is capable of oxidizing the metal surface in the matrix of the adhesion-promoting composition. The inventors have found hydrogen peroxide and persulfates to be particularly preferred oxidizers for use in the process of the invention, with hydrogen peroxide being the most preferred oxidizer. The concentration of the oxidizer in the adhesion-promoting composition may range from 6 to 60 grams per liter but is preferably from 12 to 30 grams per liter.

The acid utilized in the adhesion-promoting composition may be any acid which is stable in the matrix, however, the inventors have found mineral acids to be particularly preferred. Sulfuric acid is especially preferred. The concentration of the acid in the adhesion-promoting composition may range from 5 to 360 grams per liter but is preferably from 70 to 110 grams per liter.

The corrosion inhibitor used in the adhesion-promoting composition is a compound which effectively reacts with the metal surface to form a protective complex layer. Preferred corrosion inhibitors are selected from the group consisting of triazoles, benzotriazoles, tetrazoles, imidazoles, benzimidazoles and mixtures of the foregoing. The concentration of the corrosion inhibitor in the adhesion-promoting composition may range from 1 to 20 grams per liter but is preferably from 6 to 12 grams per liter.

A source of halide ions is preferred and may be any compound which would provide halide ions in the matrix of the adhesion-promoting composition. Preferably, the source of halide ions are alkali metal salts such as sodium chloride or potassium chloride, oxohalides such as sodium chlorate or potassium chlorate, or halide bearing mineral acids such as hydrochloric acid. Most preferably the source of halide ions provides chloride ions to the adhesion-promoting composition. The concentration of the source of halide ions in the adhesion-promoting composition may range from 5 to 500 milligrams per liter but is preferably from 10 to 50 milligrams per liter, all based on halide ion content.

Optionally, but preferably, the adhesion-promoting composition also comprises a water soluble polymer. Preferably the water soluble polymer is not a wetter or surfactant but is instead a water soluble homopolymer or copolymer of low molecular weight. Most preferably, the water soluble polymer is a polymer of ethylene oxide, an ethylene oxide-propylene oxide copolymer, polyethylene glycols, polypropylene glycols or polyvinyl alcohols. Among the most preferred are the polymers of ethylene oxide, or polyethylene glycols sold by the Union Carbide company under the tradename Carbowax. The inventors have found Carbowax 750 and Carbowax MPEG 2000 to be particularly useful. Also particularly useful are the ethylene oxide polymers or ethylene oxide-propylene oxide copolymers sold by the BASF company under the Pluronic tradename. The concentration of the water soluble polymer in the adhesion-promoting composition can range from 1 to 15 grams per liter, but is preferably from 3 to 6 grams per liter. The inventor has found that the proper combination of halide and water soluble polymer provide the best possible results in creating improved bonding and reliability between metal surfaces and polymeric bonding materials.

The metal surface can be treated with the adhesion-promoting composition in a variety of ways, including immersion, spray, or flood. The temperature of the adhesion-promoting composition during treatment may range from 80° F. to 150° F. but is preferably from 90° F. to 120° F. The treatment time will vary depending upon the temperature and method of treatment but may range from 15 seconds to 15 minutes and is preferably from 1 to 2 minutes.

After the acidic oxidant treatment, the metal surface is treated with an alkaline solution. The preferred alkaline solution is an aqueous alkaline solution of alkali metal hydroxide (e.g. sodium hydroxide or potassium hydroxide); alkali metal carbonates (e.g. sodium carbonate or potassium carbonate); alkali metal phosphates (e.g. sodium phosphate or potassium phosphates); or amines or mixtures of those chemicals. The preferred amount of such chemicals in the aqueous solution will depend upon the particular chemical employed as well as the exact use involved. Most preferably an aqueous solution of sodium or potassium hydroxide is used as the alkaline treatment, with the concentration of sodium or potassium hydroxide ranging from 2 to 150 grams per liter, most preferably from 25 to 50 grams per liter. Contact may be made by immersion, conveyorized flood or spray, however conveyorized flood is preferred. Contact time may range from 20 seconds to 10 minutes but 1 to 3 minutes is preferred. Contact temperature may range from room temperature to 160° F. but 65 to 100° F. is preferred. This alkaline treatment reduces the number of flaws in the finished laminated product.

After this alkaline treatment and water rinsing, the treated metal surface can be bonded to polymeric material by any conventional process.

The present invention is further described in detail by means of the following Examples and Comparisons. All parts and percentages are by weight unless explicitly stated otherwise.

COMPARATIVE EXAMPLE

After a cleaning step, panels with copper foil completely covering the surface on both sides were treated with an adhesion promoting solution containing:

| | |
|---|---|
| Sulfuric acid | 5% by Volume |
| Hydrogen Peroxide (50%) | 5% by Volume |
| Benzotriazole | 5 gr/l |
| Carbowax MPEG 2000 | 3 gr/l |
| Sodium Chloride | 40 mg/l |
| Water | Balance |

Treatment was provided for in a conveyorized flood machine. The parts were rinsed and dried. A one ounce copper foil was also treated to be pressed for measurement of the peel strength of the coating following lamination. After this treatment the panels and foils were covered with a uniform dark, purple/pink coating. The panels were baked thirty minutes in air at 110° C. and laminated with Nelco N4205-2 1080B stage material ($T_g$ approximately 140° C.) and two cap sheets of two ounce zinc treated foil to create a finished panel containing four innerlayers. The treated foil was also laminated in a similar fashion against a treated panel. After lamination, the panels containing innerlayers were drilled and processed for plating through the following standard plated through hole cycle:

| | |
|---|---|
| MacDermid 9204, 110° F.* | 5 minutes |
| Cold Water Rinse | 2 minutes |
| MacDermid 9275, 165° F.* | 15 minutes |
| Cold Water Rinse | 1 minute |
| Cold Water Rinse | 2 minutes |
| MacDermid 9279, 110° F.* | 5 minutes |
| Cold Water Rinse | 2 minutes |
| MacDermid Conditioner 90, 120° F.* | 5 minutes |
| Cold Water Rinse | 5 minutes |
| MacDermid G-4 Microetch, 85° F.* | 1 minute |
| Cold Water Rinse | 1 minute |
| MacDermid 93 Predip* | 1 minute |
| MacDermid 95 Activator* | 5 minutes |
| Cold Water Rinse | 1 minute |
| Cold Water Rinse | 2 minutes |
| MacDermid 97 Accelerator, 110° F.* | 2.5 minutes |
| Cold Water Rinse | 2 minutes |
| MacDermid M-85 Electroless Copper* | 30 minutes |
| Cold Water Rinse | 2 minutes |
| MacDermid 9271 Acid Cleaner* | 2 minutes |
| Cold Water Rinse | 2 minutes |
| MacDermid G-4 Microetch* | 15 seconds |
| Cold Water Rinse | 2 minutes |
| 10% Sulfuric Acid | 1 minutes |
| MacDermid 9241 Acid Copper, 20 ASF* | 40 minutes |
| Cold Water Rinse | 2 minutes |

*Note - These products are available from MacDermid, Incorporated, 245 Freight Street, Waterbury, CT. 06702. MacDermid is a trademark of MacDermid, Incorporated. These products were prepared and operated according to the manufacturer's published instructions for printed circuit plated through-hole operation.

The panels were then dried, sectioned and punched for solder shock and evaluation of the quality of the panel. The following results were observed:

Peel Strength After Solder Immersion at 550° F.

| 0 Seconds | 10 Seconds | 20 Seconds |
|---|---|---|
| 4.2–4.5 lbs/in | 4.8–5.0 lbs/in | 5.0 lbs/in |

Significant wedging and approximately 4 mils of pink ring were observed.

Approximately 22% of the treated innerlayers exhibited small resin voids within the area of pink ring after solder shocking for ten seconds at 550° F.

Example 1

Samples of copper clad panels and one ounce foil were treated with the adhesion promoting solution as in the Comparative Example; however, the panels were not dried after the final rinse. They were immersed in an aqueous solution of 38 g/L sodium hydroxide at 70° F. for thirty seconds, rinsed thoroughly and dried. The treated panels and foil were then baked, laminated and processed as in the Comparative Example. After cross sectioning and soldering the following results were observed:

Peel Strength After Solder Immersion at 550° F.

| 0 Seconds | 10 Seconds | 20 Seconds |
|---|---|---|
| 6.0–6.2 lbs/in | 5.0–5.2 lbs/in | 4.5–4.8 lbs/in |

No wedging and no pink ring was observed.
No evidence of resin voids was observed after floating in solder at 550° F. for ten seconds.

Example 2

Panels and foils were treated by a process similar to that of Example 1, except that the 38 g/L sodium hydroxide solution was sprayed instead of using a dip. One set of panels and foil was treated with a fifteen second spray, another set with a thirty second spray. After drying, baking, laminating, processing, and cross sectioning as in Example 1, the following results were observed:

Peel Strength After Solder Immersion at 550° F.

| Treatment Time | 0 Seconds Solder | 10 Seconds Solder | 20 Seconds Solder |
|---|---|---|---|
| 15 Seconds | 6.8 lbs/in | 5.8–6.0 lbs/in | 5.5–5.8 lbs/in |
| 30 Seconds | 6.2–6.5 lbs/in | 5.5 lbs/in | 5.0–5.2 lbs/in |

No wedging and no evidence of pink ring were observed.
No evidence of resin voids was observed after floating in solder at 550° F. for ten seconds.

While the invention has been described above with reference to specific embodiments thereof, it is apparent that many changes, modifications and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A process for adhering a polymeric resin to a metal surface, said process comprising:
   (a) contacting the metal surface with an adhesion promoting composition comprising:
      1. an oxidizer;
      2. an acid;
      3. a corrosion inhibitor;
      4. optionally, a source of halide ions;
      5. optionally, a water soluble polymer; and
   (b) thereafter contacting the metal surface with an alkaline solution; and
   (c) thereafter adhering a polymeric resin to said metal surface.

2. The process according to claim 1 wherein the oxidizer is selected from the group consisting of hydrogen peroxide and persulfates.

3. The process according to claim 1 wherein the acid is a mineral acid.

4. The process according to claim 1 wherein the corrosion inhibitor is selected from the group consisting of triazoles, benzotriazoles, imidazoles, benzimidazoles, tetrazoles and mixtures of the foregoing.

5. The process according to claim 1 wherein the water soluble polymer is selected from the group consisting of polymers of ethylene oxide, ethylene oxide-propylene oxide copolymers, polyethylene glycols, polypropylene glycols, polyvinyl alcohols, and mixtures of the foregoing.

6. The process according to claim 5 wherein the metal surface comprises copper.

7. The process according to claim 1 wherein the metal surface comprises copper.

8. The process according to claim 6 wherein the oxidizer is selected from the group consisting of hydrogen peroxide and persulfates.

9. The process according to claim 6 wherein the corrosion inhibitor is selected from the group consisting of triazoles, benzidazoles, tetrazoles and mixtures of the foregoing.

10. The process according to claim 9 wherein the acid is a mineral acid.

11. The process according to claim 10 wherein the water soluble polymer is selected from the group consisting of polymers of ethylene oxide, ethylene oxide-propylene oxide copolymers, polyethylene glycols, polypropylene glycols, polyvinyl alcohols, and mixtures of the foregoing.

12. The process according to claim 10 wherein the source of halide ions is selected from the group consisting of alkali metal halide salts and oxohalide salts.

13. The process according to claim 10 wherein the source of halide ions is a source of chloride ions.

14. The process according to claim 11 wherein the source of halide ions is a source of chloride ions.

15. The process of claim 1 wherein said alkaline solution is an aqueous solution of at least one compound selected from the group consisting of alkali metal hydroxides, alkali metal carbonates, alkali metal phosphates, amines, and mixtures thereof.

16. The process of claim 15 wherein said compound is an alkali metal hydroxide selected from the group consisting of sodium hydroxide and potassium hydroxide.

17. The process of claim 15 wherein said compound is an alkali metal carbonate selected from the group consisting of sodium carbonate and potassium hydroxide.

18. The process of claim 15 wherein said compound is an alkali metal phosphate selected from the group consisting of sodium phosphate and potassium phosphate.

19. A process for bonding a metal surface to an adhesive layer, said process comprising:
   (a) contacting the metal surface with an adhesion-promoting composition comprising:
      1. an oxidizer;
      2. an acid; and
      3. a corrosion inhibitor; thereafter
   (b) contacting the metal surface with an alkaline solution; and thereafter
   (c) bonding the adhesive layer to the metal surface.

20. A process according to claim 19, wherein the adhesion-promoting composition also comprises an additive selected from the group consisting of a source of halide ions, water soluble polymer, and mixtures of the foregoing.

* * * * *